(12) United States Patent
Shachar et al.

(10) Patent No.: US 8,552,867 B2
(45) Date of Patent: Oct. 8, 2013

(54) RADIO FREQUENCY IDENTIFICATION FOR COLLECTING STAGE-BY-STAGE MANUFACTURING AND/OR POST-MANUFACTURING INFORMATION ASSOCIATED WITH A CIRCUIT BOARD

(75) Inventors: Rony Shachar, Los Altos, CA (US); Srivats Ramaswami, Saratoga, CA (US); David Anderson, Montara, CA (US)

(73) Assignee: Sanmina-SCI Corporation, San Jose, CA (US)

( * ) Notice: Subject to any disclaimer, the term of this patent is extended or adjusted under 35 U.S.C. 154(b) by 159 days.

(21) Appl. No.: 13/233,872

(22) Filed: Sep. 15, 2011
(Under 37 CFR 1.47)

(65) Prior Publication Data
US 2012/0146794 A1 Jun. 14, 2012

Related U.S. Application Data

(63) Continuation-in-part of application No. 13/031,217, filed on Feb. 20, 2011, now Pat. No. 8,188,866, and a continuation-in-part of application No. 11/336,213, filed on Jan. 20, 2006, now Pat. No. 7,893,833.

(51) Int. Cl.
*G08B 13/14* (2006.01)

(52) U.S. Cl.
USPC .............. 340/572.1; 340/572.4; 340/572.8; 340/5.72; 340/10.52; 235/375; 235/382; 235/385; 235/492

(58) Field of Classification Search
USPC ............ 340/572.1, 572.4, 572.7, 572.8, 5.72, 340/10.52; 235/375, 382, 385, 492
See application file for complete search history.

(56) References Cited

U.S. PATENT DOCUMENTS

| | | | | |
|---|---|---|---|---|
| 2002/0125997 A1* | 9/2002 | Kashi et al. | ................ | 340/10.52 |
| 2006/0109119 A1* | 5/2006 | Burr et al. | ................ | 340/572.1 |

* cited by examiner

*Primary Examiner* — Tai T Nguyen
(74) *Attorney, Agent, or Firm* — Julio M. Loza; Loza & Loza, LLP

(57) ABSTRACT

A radio frequency identification (RFID) tag is coupled to a circuit board to track the specific operating and environmental conditions of each stage as the circuit board passes through one or more manufacturing and/or post-manufacturing stages. An RFID reader and data collector are used at each stage to read the RFID tag and store its identifying information along with processing information, operating conditions, and results for each stage. This permits to quickly and accurately collect manufacturing and post-manufacturing information for each circuit board at various stages as well as the operating conditions for each stage at a particular time. Such manufacturing and/or post-manufacturing metrics can then be retrieved on a stage-by-stage basis for a particular circuit board by an identifier associated with the circuit board.

16 Claims, 10 Drawing Sheets

Serial Number: PT2B40R9PP04  
Location: COMP Finished – Completed  
Status: Finished Part Number: BHA3146  
Revision: AG Quantity: 1

| Entry Number | Date | Time | Operator | Process | Action | Data |
|---|---|---|---|---|---|---|
| 0 | 1/11/2005 | 20:47:44 | 08015 | 2$^{nd}$ Hand Load | Create | |
| 1 | 1/11/2005 | 20:47:46 | 08015 | 2$^{nd}$ Hand Load | Add Component | 1 |
| 2 | 1/11/2005 | 20:47:47 | 08015 | 2$^{nd}$ Hand Load | Pass to | PreB |
| 3 | 1/11/2005 | 21:43:25 | 07785 | Pre Burn-In | Pass to | Burn |
| 4 | 1/12/2005 | 08:15:03 | 07996 | Burn-In | Pass to | PosB |
| 5 | 1/12/2005 | 10:42:53 | 07886 | Post Burn-In | Pass to | FCTS |
| 6 | 1/12/2005 | 10:47:10 | 07886 | Functional Test | Pass to | VMIS |
| 7 | 1/13/2005 | 21:19:17 | 66281 | Visual Test | Pass to | PACK |
| 8 | 1/13/2005 | 21:32:00 | 08566 | Pack Out | Pass to | COMP |

RADIO FREQUENCY IDENTIFICATION FOR COLLECTING STAGE-BY-STAGE MANUFACTURING AND/OR POST-MANUFACTURING INFORMATION ASSOCIATED WITH A CIRCUIT BOARD

CLAIM OF PRIORITY UNDER 35 U.S.C. §119

The present application for patent is a continuation-in-part of, and claims priority to, U.S. Utility application Ser. No. 11/336,213 entitled "Inline System for Collecting Stage-By-Stage Manufacturing Metrics" filed Jan. 20, 2006 now U.S. Pat. No. 7,893,833, and U.S. Utility Application No. 13/031,217 entitled "Circuit Board with Radio Frequency Identification for Collecting Stage-By-Stage Manufacturing Metrics" filed Feb. 20, 2011 now U.S. Pat. No. 8,188,866, both of which are assigned to the assignee hereof and hereby expressly incorporated by reference herein.

FIELD

Various embodiments of the invention pertain to tracking and collecting circuit board metrics. More specifically, at least one embodiment provides for using an RFID tag in the circuit boards to track conditions of various manufacturing, assembly, inventory control, and/or distribution stages of the circuit boards.

BACKGROUND

In manufacturing processes, such as circuit board manufacturing, it is often desirable to determine conditions at various stages of the process. This may be helpful in determining whether a particular manufacturing stage is operating under optimal conditions or whether it is operating close to failure conditions. Conventional manufacturing methods tend to rely on human interaction or monitoring to gauge the condition of particular manufacturing stages. This is inconvenient, time consuming, and costly in terms of resources. Other methods may employ automated monitoring techniques, such as sensors, to measure some conditions at a manufacturing stage. However, these sensors typically do not provide information about each product (e.g., circuit board) processed at a particular manufacturing stage and/or how well the particular process was applied to each product.

Additionally, determining whether a product failure was due to manufacturing defect, component failure, or improper use is important in many cases. For instance, whether a circuit board failure was caused by improper use or product defect may determine whether the failure was an isolated incident or whether all circuit boards in the same batch are susceptible to such failure and, therefore, should be recalled or returned. Currently, it is difficult and time consuming to determine whether a whole batch of circuit boards are susceptible to defects.

One problem in tracking the manufacturing conditions of particular circuit boards across various manufacturing stages is how to individually identify each circuit board. Because circuit boards are exposed to various chemicals and mechanical processes during manufacturing, it is impractical to print a number, barcode, or other identifier on the surface of each circuit board. That is, the chemicals and/or mechanical processes tend to remove or damage such identifiers on the circuit boards.

An additional problem exists in tracking circuit boards beyond the manufacturing stages. For instance, it may be advantageous to continue to track the circuit boards (and even products that incorporate said circuit boards) during a subsequent assembly, warehousing, and distribution stage.

Thus, a system and/or method are needed to accurately track circuit boards at various manufacturing, assembly, inventory control, and/or distribution stages.

SUMMARY

A radio frequency identification (RFID) tag is coupled to a circuit board to track the specific operating and environmental conditions of each manufacturing stage as the circuit board passes through the manufacturing stages. An RFID reader and data collector are used at various manufacturing stages to read the RFID tag and store its identifying information along with processing information, operating conditions, and results for each stage. This permits to quickly and accurately collect manufacturing information for each circuit board at various manufacturing stages as well as the operating conditions for each stage at a particular time. Such manufacturing metrics can then be retrieved on a stage-by-stage basis for a particular circuit board by an identifier printed on the circuit board.

Additionally, in some implementations, the RFID tag may remain part of the circuit board after manufacturing. Thus, this RFID tag may continue to be used to track the location, conditions, and/or inventory the corresponding circuit board using RFID readers and data collectors. For instance, the RFID tag in the circuit board may be used during a subsequent assembly stage (e.g., where the circuit board is integrated into a device), in a subsequent inventory control stage, and/or a distribution stage.

One embodiment provides a multi-layer substrate comprising: (a) one or more circuits boards defined on the multi-layer substrate; (b) one or more automated optical inspection holes formed on the substrate and configured to identify the position and orientation of the one or more circuit boards; and/or (c) a radio frequency identification (RFID) tag coupled to the multi-layer substrate inside at least one of the automated optical inspection holes, the RFID tag configured to identify the one or more circuit boards as they pass through a plurality of stages of a manufacturing process. In some implementations, the one or more automated optical inspection holes may be located along a perimeter of the substrate outside substrate areas defining the one or more circuit boards. Such perimeter may remain with the circuit boards after manufacturing or it may be detached/removed from the circuit boards. In other implementations, the optical inspection holes may be located within areas defining the one or more circuit boards. The multi-layer substrate may include a plurality of dielectric and conductive layers, each circuit board including an electrical circuit. The RFID tag may be used to collect stage-by-stage manufacturing information for each stage of the manufacturing process and associate the stage-by-stage manufacturing information with each of the one or more circuit boards. An identifier may be stored in the RFID tag and associated with the one or more circuit boards, the identifier being read from the RFID tag at a plurality of stages of the manufacturing process to identify the one or more circuit boards and associate the one or more circuit boards with manufacturing information for each stage of the manufacturing process. The manufacturing information includes at least one of operating conditions, results, and/or other metrics for each stage of the manufacturing process. Each of the one or more circuit boards may include a unique serial number or barcode that identifies the manufacturing information collected during the plurality of stages of the manufacturing process. The RFID tag may store a part number and a circuit board identifier associated with the one or more circuit boards. The RFID tag is removable from the at least one automated optical inspection hole after completion of the plurality of stages of the manufacturing process. The one or more circuit boards may be detachable from the portions of the multi-layer substrate upon completion of the manufacturing process.

A second embodiment provides a multi-layer circuit board comprising: (a) a substrate defining one or more electrical circuits; (b) one or more automated optical inspection holes formed along non-circuit portions of the substrate; and/or (c) a radio frequency identification (RFID) tag positioned inside at least one of the automated optical inspection holes, the RFID tag configured to identify the circuit board as it passes through each stage of its manufacturing process. The one or more automated optical inspection holes may serve to identify the position and orientation of the multi-layer circuit board during the manufacturing process. The one or more automated optical inspection holes may be located along a perimeter of the substrate or within circuit board regions of the substrate. The RFID tag may be used to collect stage-by-stage manufacturing information for each stage of the manufacturing process and associate the stage-by-stage manufacturing information with the multi-layer circuit board. An identifier may be stored in the RFID tag and associated with the multi-layer circuit board, the identifier may be read from the RFID tag at a plurality of stages of the manufacturing process to identify the multi-layer circuit board and associate the multi-layer circuit board with manufacturing information for each stage of the manufacturing process.

A third embodiment provides a circuit board, comprising: (a) a multi-layer substrate defining one or more electrical circuits; and/or (b) a radio frequency identification (RFID) tag embedded between two layers of the multi-layer substrate during a manufacturing process, the RFID tag configured to identify the circuit board as it passes through each stage of its manufacturing process. The RFID tag may be positioned to avoid interfering with circuit routing or vias formed of the one or more electrical circuits. The RFID tag may be used to collect stage-by-stage manufacturing information for each stage of the manufacturing process and associate the stage-by-stage manufacturing information with the circuit board. The circuit board may further comprise a unique serial number or barcode that identifies stage-by-stage manufacturing information collected during a plurality of stages of the manufacturing process.

Another embodiment of the invention provides a system for collecting stage by stage manufacturing metrics for a circuit board during manufacturing, comprising: (a) a circuit board having a radio frequency identification (RFID) tag with an identifier, (b) one or more RFID readers positioned at one or more stages of the manufacturing process and configured to read identifiers from RFID tags as they come within reach of its radio signal, (c) one or more data collectors coupled to the one or more RFID readers to store the identifiers read from RFID tags along with stage by stage manufacturing information for the manufacturing stage, (d) a database to store the identifiers and stage-by-stage manufacturing information collected by the one or more data collectors, (e) an RFID writer to obtain an identifier for the circuit board and write it to the RFID tag on the circuit board, (f) a barcode writer for writing a barcode on the circuit board corresponding to the identifier stored in the RFID tag. The circuit board may also include an automated optical inspection hole in which the RFID tag is placed.

Another feature of the system for collecting stage by stage manufacturing metrics for the circuit board during manufacturing includes a reporting server coupled to the database and configured to (1) receive requests for manufacturing information about a particular circuit board, (2) retrieve the requested information from the database, and (3) send the requested information to the requesting party. The requested information may include operating conditions for the manufacturing stages of the circuit board.

Having collected metrics during a manufacturing stage, the RFID tags may also remain with the circuit boards and serve to collect additional information and/or track the circuit board during subsequent stages, such as an assembly stage, as storage state (e.g., for inventory control), and/or a distribution stage.

A method for tracking a circuit board is also provided, comprising: (a) coupling a radio frequency identification (RFID) tag to a substrate including a circuit board, the RFID tag having an associated identifier; (b) tracking the circuit board through one or more manufacturing stages using the RFID tag to collect one or more manufacturing metrics for the one or more manufacturing stages of the circuit board; (c) tracking the circuit board through one or more post-manufacturing stages using the RFID tag to collect one or more post-manufacturing metrics for the one or more post-manufacturing stages of the circuit board; (d) associating the identifier with the collected one or more manufacturing metrics and location or status information of the circuit board; (e) storing the collected one or more manufacturing metrics and location or status information of the circuit board.

The RFID tag may be coupled to the substrate prior to adding electrical components to the circuit board. The one or more post-manufacturing stages may include at least one of an assembly stage, a warehousing stage, and a distribution stage. The RFID tag may be inserted within an optical inspection hole of the circuit board. The one or more manufacturing metrics includes operating conditions of the manufacturing process. The circuit board may be integrated into another device during the one or more post-manufacturing stages, the RFID tag used to track the device. The substrate may include a plurality of dielectric and conductive layers that form a multilayer circuit board.

Another method for tracking a circuit board is also provided, comprising: (a) coupling a radio frequency identification (RFID) tag to a substrate including a circuit board; (b) assigning an identifier to the RFID tag; (c) scanning the RFID tag for its identifier at one or more manufacturing stages to track the progress of the circuit board; (d) obtaining one or more manufacturing metrics for the circuit board at the one or more manufacturing stages; (e) storing the identifier and the one or more manufacturing metrics for the one or more manufacturing stages of the circuit board; (f) scanning the RFID tag for its identifier at one or more post-manufacturing stages of the circuit board; (g) obtaining at least one of a location or a status information for the circuit board at the one or more post-manufacturing stages; and/or (h) storing the at least one location or status information for the one or more post-manufacturing stages of the circuit board.

The one or more post-manufacturing stages may include at least one of an assembly stage, a warehousing stage, and a distribution stage. The RFID tag may be inserted within an optical inspection hole of the circuit board. The one or more manufacturing metrics may include operating conditions of the manufacturing process. The one or more post-manufacturing stages may include an inventory control stage. The circuit board may be integrated into another device during the one or more post-manufacturing stages, the RFID tag used to track the device. The one or more manufacturing metrics and location or status information may be centrally stored by a server.

Additionally, a method for tracking a plurality of components included as part of a composite product is also provided, comprising: (a) scanning radio frequency identification (RFID) tags for one or more different components during one or more manufacturing and post-manufacturing stages of the components, where each RFID tag uniquely identifies a component or subset of components; (b) collecting information for each component at each of the one or more manufacturing and post-manufacturing stages based on the RFID tags; (c) assembling a subset of the one or more different components into a product; (d) performing validation of the product by scanning the combined RFID tags in the product after a product assembly stage; (e) collecting information for the assembled product to ascertain whether a particular combination of components results in defective operation of the product; and/or (f) using the collected information to avoid subsequent combinations of components known to result in defective operation of the product.

BRIEF DESCRIPTION OF THE DRAWINGS

FIG. 5 illustrates a sample manufacturing report for a particular circuit board according to one embodiment of the invention.

DETAILED DESCRIPTION

In the following description numerous specific details are set forth in order to provide a thorough understanding of the invention. However, one skilled in the art would recognize that the invention might be practiced without these specific details. In other instances, well known methods, procedures, and/or components have not been described in detail so as not to unnecessarily obscure aspects of the invention.

In the following description, specific details are given to provide a thorough understanding of the embodiments. However, it will be understood by one of ordinary skill in the art that the embodiments may be practiced without these specific detail. For example, circuits or processes may be shown in simplified diagrams in order not to obscure the embodiments in unnecessary detail. In other instances, well-known circuits, structures, processes and techniques may not be described in detail so as not to obscure the embodiments.

One feature of the invention provides for coupling radio frequency identification (RFID) tags to circuit boards to individually help track each circuit board and the manufacturing conditions at various manufacturing stages.

Another aspect of the invention provides a system that quickly and accurately collects manufacturing information for each item at various manufacturing stages.

Yet another feature of the invention provides a report mechanism for obtaining manufacturing metrics, such as manufacturing conditions, test results, responsible operators, etc., at various manufacturing stages of a particular circuit board.

Figure 1:
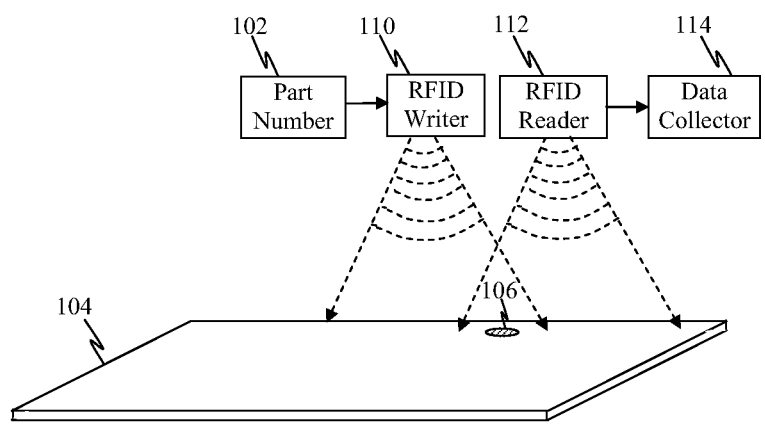
FIG. 1 illustrates how an RFID tag may be coupled to a circuit board during an initial manufacturing stage to help track the manufacturing conditions of the individual circuit board according to one embodiment of the invention.

FIG. 1 illustrates how an RFID tag may be coupled to a circuit board during an initial manufacturing stage to help track the manufacturing conditions of the individual circuit board according to one embodiment of the invention. Note that, as used herein, the term "circuit board" includes, but is not limited to, multi-layer boards, film substrates, flex circuits, multi-chip modules, printed circuit boards, and other types of liquid-laid, flexible, semi-flexible, semi-rigid and/or rigid substrates for forming electrical circuits or having dielectric material. Circuit boards typically undergo various stages of manufacturing, including forming one or more dielectric layers (e.g., resin reinforced layers), forming conductive traces on the circuit board (e.g., etching and plating), forming vias between layers (e.g., drilling holes), mounting electric components on the circuit board, and/or testing of the circuits on the circuit board. These stages involve chemical and/or mechanical processes that may be performed, partially or completely, in an assembly line where the circuit board moves from one stage to another.

During manufacturing, a part number 102 is typically assigned to a circuit board 104 being manufactured. The part number 102 may be obtained from a list of instructions describing the board (also known as a shop traveler, routing sheet, job order, or production order) which may also include specific processing requirements for the circuit board 104. The part number 102 may be electronically obtained (e.g., from a computer), optically acquired (e.g., by reading a barcode from the traveler), or manually entered by an operator and then transferred to an RFID tag 106 by an RFID writer 110.

In some implementations, in addition to the part number 102, an identifier (e.g., a serial number for a circuit board) may also be stored in the RFID tag 106. The part number and/or identifier may be sent by the RFID writer 110 to the RFID tag 106 via radio signals (e.g., directional or omnidirectional signal broadcasts), electro-magnetic signals, electrical signals (e.g., through direct contacts on the RFID tag 106), or other means.

Alternatively, the RFID tag 106 may have an embedded identifier created during the manufacturing of the RFID tag 106. In such, embodiment, the RFID writer 110 is unnecessary. The RFID identifier may simply be read from the RFID tag 106 and then associated with the part number 102 and/or serial number corresponding to the circuit board 104.

In various implementations, the part number 102 and/or the identifier stored in the RFID tag 106 may be a number, an alpha-numeric code, or symbols. The same part number and/or identifier may be used by a plurality of RFID tags (e.g., a plurality of RFID tags have the same part number to identify a particular group of circuit boards) and/or a unique identifier may be used by each RFID tag (e.g., each number uniquely identifies each circuit board).

In some embodiments of the invention, the RFID tag 106 may be inserted into an automated optical inspection (AOI) hole in the circuit board 104. Such AOI holes are typically used in many manufacturing processes for identifying the position and/or orientation of a circuit board. Using an AOI hole to hold the RFID tag 106 uses an existing feature of circuit board manufacturing process, thereby avoiding having to add new holes, and embeds the RFID tag in a place where it does not interfere with the chemical and/or mechanical processing of the circuit board 104. In fact, by placing the RFID tag 106 inside an AOI hole the RFID tag 106 may be protected from mechanical processes, such as pressing or surface planning, is not affected by chemical processes (e.g., etching, plating, etc.), and does not interfere with the manufacturing of the circuit board 104.

In various implementations, the RFID tag 106 may be coupled (e.g., inserted in an AOI hole) to the circuit board 104 at different stages of manufacturing. For example, the RFID tag 106 may be coupled to the circuit board 104 at the lay-up stage once a substrate has been formed. If a multilayer circuit board is involved, the RFID tag 106 may be coupled to the circuit board during the formation of the first layer, a middle layer, the last layer, or after the last layer of the multilayer circuit board. In some instances, the RFID tag may be positioned in a place (e.g., AOI holes) from which it can be removed after the circuit board manufacturing process is completed. In other implementations, the RFID tag may be embedded in a circuit board as it is being made. For instance, the RFID tag may be embedded in the resin used to form a layer of a circuit board or it may be embedded in between two layers of a multilayer circuit board. When the RFID tag is embedded in the circuit board, it is positioned such that it will not interfere with circuit routing or vias formed on the circuit board. For example, the RFID tag may be positioned on the perimeter of the circuit board which is cut away or removed once the circuit board manufacturing process is completed.

After the RFID tag 106 has been coupled to the circuit board 104, it may be identified and/or tracked through various manufacturing stages.

An RFID reader 112 may read the part number and/or identifier from the RFID tag 106 using radio signals and provide the part number and/or identifier to a data collector 114. The data collector 114 may store this information for later retrieval. Thus, as the circuit board 104 passes through various manufacturing stages, a tracking system having RFID readers and data collectors at such manufacturing stages can identify the particular circuit board by its RFID tag 106 and record the operating conditions, processing results, responsible operator, and other information for the particular stage and/or circuit board.

Figure 2:
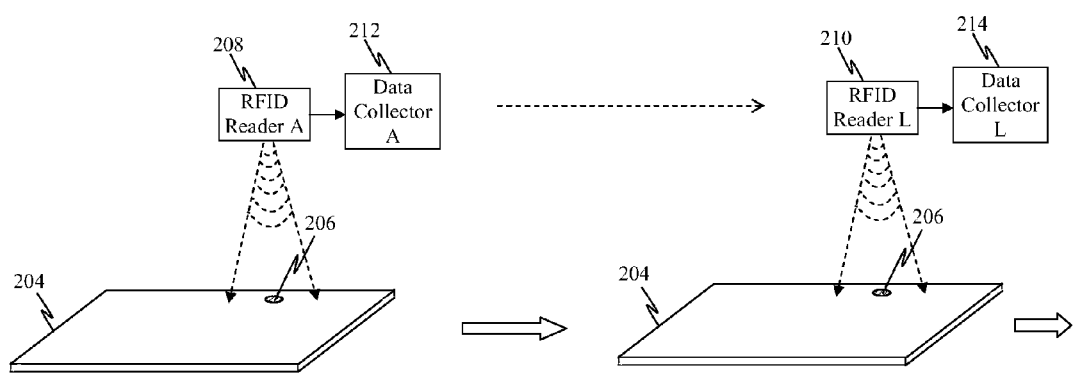
FIG. 2 illustrates a circuit board including an RFID tag to track and monitor the specific operating conditions and results through various manufacturing stages according to one embodiment of the invention.

FIG. 2 illustrates a circuit board including an RFID tag 206 to track and monitor the specific operating conditions and results through various manufacturing stages according to one embodiment of the invention. As illustrated in FIG. 1, the circuit board 204 may have been identified and/or associated with the RFID tag 206 coupled to the circuit board 204 at an initial manufacturing stage.

As the circuit board 204 passes through various manufacturing stages, it is identified by a plurality of RFID readers 208 and 210. That is, as the circuit board 204 enters or leaves a particular processing stage, an RFID reader 208 or 210 reads a part number and/or identifier from the RFID tag 206 and stores it in a data collector 212 or 214. In this manner, information about the circuit board's progress can be collected. Along with reading the part number and/or identifier from the RFID tag 206 and storing it in the data collector 212 and 214, the data collector 212 and 214 at each stage may also store the date and time in which the RFID tag is read, the name or identifier of the particular stage, the name or number of the operator (if any) responsible for the particular stage, data collected, results, and/or status or the condition of the particular stage. In this manner, the condition, quality, or effectiveness of each manufacturing stage for the circuit board 204 can be obtained. That is, once the RFID tag 206 is read, the part number and/or identifier therein can be associated with the information obtained for each manufacturing stage.

Some of the stages at which a circuit board 204 may be tracked or monitored using its RFID tag 206 may include: Prepreg Lay-Up, Pressing, Drilling, Hole Plugging, Dry Film Outerlayer, Plating, Strip-Etch-Strip (SES), Solder Masking, Surface Finishing (including Nickel/Gold, Tin immersion, anti-tarnish (OSP), Silver), Routing, electrical test, Surface Mounting, Final Quality Assurance, etc.

According to various implementations, the circuit board 204 may be automatically tracked by one or more RFID readers 208 and 210 as it moves on a conveyor belt from stage to stage and/or manually tracked by an operator presenting the circuit board to an RFID reader 208 and/or 210 at one or more manufacturing stages.

Figure 3:
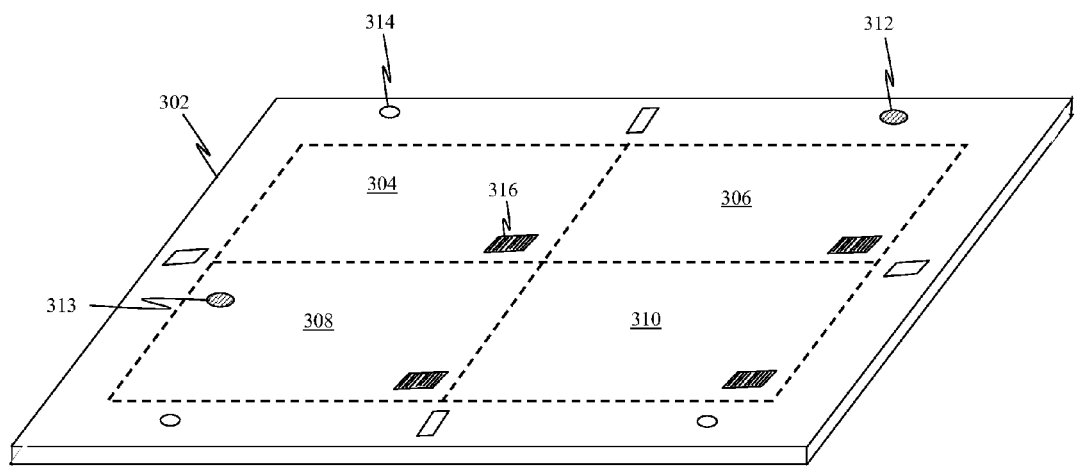
FIG. 3 illustrates another implementation of the invention in which a single substrate has a plurality of circuit boards thereon which are tracked by a single RFID tag

FIG. 3 illustrates another implementation of the invention in which a single substrate 302 has a plurality of circuit boards thereon which are tracked by a single RFID tag 312. In this embodiment, a plurality of circuit boards 304, 306, 308, and 310 are formed on a single substrate 302 and an RFID tag 312 is coupled to the substrate 302 in an area outside the circuit boards 304, 306, 308, and 310. In this manner, a single RFID tag 312 may be used to track the plurality of circuit boards 304, 306, 308, and 310 and the operating conditions, results, and/or other metrics for various manufacturing stages. This implementation is particularly useful where multiple circuit boards 304, 306, 308, and 310 are processed (e.g., formed and/or tested) at the same time.

Another novel feature of this embodiment is that the RFID tag 312 is placed outside the circuit boards 304, 306, 308, and 310 on the perimeter of the substrate 302. The circuit boards 304, 306, 308, and 310 are cut away from the substrate 302 prior to delivery leaving the RFID tag 312 behind on the unused frame area. Thus, the RFID tag 312 is not delivered with the circuit boards 304, 306, 308, and 310. In an alternative embodiment, a frame may hold one or more circuit boards as they progress through different manufacturing stages with the RFID tag coupled to the frame. Once, the circuit boards are completed, they can be removed from the frame. In either of these embodiments, once manufacturing of the circuit board 304, 306, 308, and 310 on substrate 302 is completed, the RFID tag 312 may be removed and reused with for tracking the manufacture of other circuit boards.

In yet other embodiments, an RFID tag 313 may be located within a circuit board 308 region and may remain with the circuit board 308 even after the manufacturing stages.

Another aspect of the invention provides for transferring information from the RFID tag 312 to the circuit board(s) 304, 306, 308, and 310. For instance, a unique serial number for each circuit board 304, 306, 308, and 310 may be generated, possibly, based on the part number and/or identifier in the RFID tag 312. This unique serial number may be printed on each circuit board 304, 306, 308, and 310 as a barcode 316 (e.g., 2-dimensional barcode). This barcode 316 may be unique to each circuit board 304, 306, 308, and 310 and can be used to later retrieve a stage-by-stage manufacturing report for a particular circuit board. This manufacturing report may include the processing information, operating conditions, functional and/or quality control test results collected and/or stored during the manufacture of the circuit board. The manufacturing report may be provided via a web-based application that retrieves the stored information collected from the data collectors at each manufacturing stage.

As previously noted, another feature of the invention provides for creating automated optical inspection (AOI) holes 314 in the substrate 302 and placing an RFID tag 312 at that position. These AOI holes 314 are already part of many circuit board manufacturing processes and are typically used by optical sensing machines to identify the position and/or orientation of a circuit board. By inserting the RFID tag inside an AOI hole, the RFID tag 312 may be held completely inside the hole and has a minimal effect on the manufacturing process of the circuit board. The RFID tag 312 fitting within an AOI hole 314 may have such dimensions that it fits completely within AOI hole 314. For example, the RFID tag 312, including the antenna, may be housed in a compact package (e.g., eight millimeter diameter round package, one millimeter thick).

Figure 4:
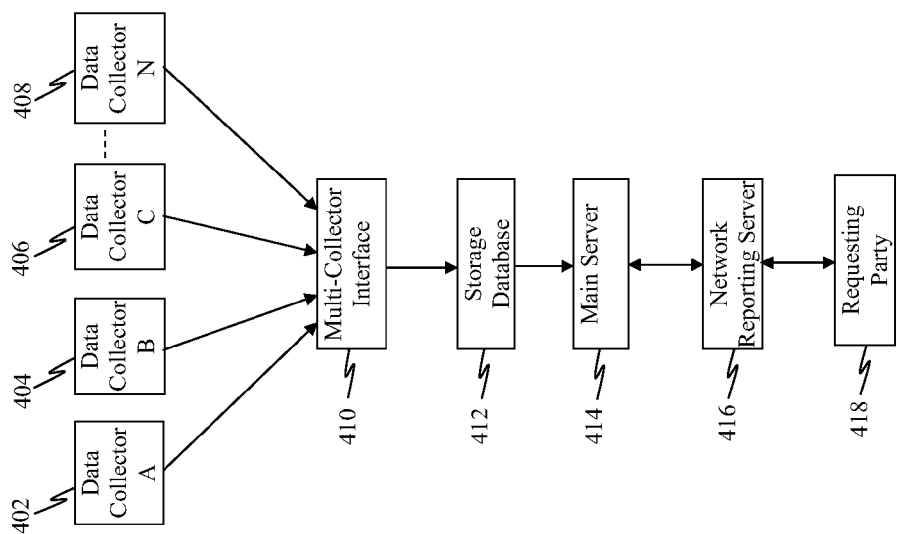
FIG. 4 is a block diagram illustrating the flow of information for a collecting and reporting stage-by-stage manufacturing information for a circuit board according to one embodiment of the invention.

FIG. 4 is a block diagram illustrating the flow of information for a collecting and reporting stage-by-stage manufacturing information for a circuit board according to one embodiment of the invention. A plurality of data collectors 402, 404, 406, and 408 may collect progress information, test results, operating conditions, and/or compliance status information for each of a plurality of manufacturing stages of a circuit board manufacturing process as illustrated in FIGS. 1 and 2. The data collectors 402, 404, 406, and 408 are coupled to a multi-collector interface 410 to transfer the information stored in the data collectors 402, 404, 406, and 408 to a storage database 412. A main server 414 may be coupled to the storage database 412 to control access to the information stored in the storage database 412.

When a requesting party 418, such as a customer, wishes to obtain information about the manufacturing conditions, results and/or other stage-by-stage manufacturing metrics for a particular circuit board, a manufacturing report may be requested via a network reporting server 416 (e.g., internet or web server). The network reporting server 416 is coupled to the main server 414 to request this stage-by-stage manufacturing information from the storage database 412. The information reported to the requesting customer is not merely limited to order fulfillment information but may also include stage-by-stage information about the manufacturing of circuit board. Such stage-by-stage manufacturing information may include the dates and times a circuit board has reached and/or finished a stage, the operator responsible for each stage, the operating condition of each stage (e.g., relative or absolute indictor of the effectiveness and/or accuracy of the particular manufacturing stage), the current and past stages reached by a circuit board, the results for each stage, and data for each stage. In one implementation, such manufacturing report may be obtained after the circuit board has been delivered (e.g., based on a particular circuit board identifier). FIG. 5 illustrates a sample manufacturing report for a particular circuit board according to one embodiment of the invention.

Figure 6:
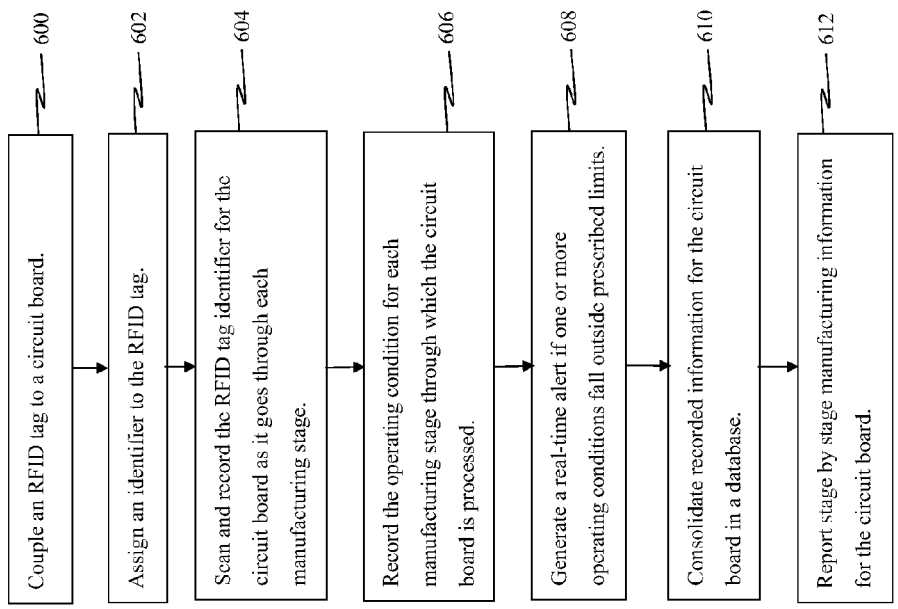
FIG. 6 is a flow diagram illustrating a method for collecting and reporting stage-by-stage manufacturing information for a circuit board according to one embodiment of the invention.

FIG. 6 is a flow diagram illustrating a method for collecting and reporting stage-by-stage manufacturing information for a circuit board according to one embodiment of the invention. An RFID tag is coupled to a circuit board 600. This may be done at an early stage of manufacturing, for example. An identifier is then assigned to the RFID tag 602. This identifier may be the part number of the circuit board or it may be a unique identifier for each circuit board. As the circuit board goes through each manufacturing stage, the RFID tag is scanned and its identifier is recorded 604. Along with the RFID tag identifier, the operating conditions or information for each manufacturing stage through which the circuit board is processed are also recorded 606. These operating conditions or information may include operator name, date and time each circuit board goes through each stage, test results for each stage, and/or relative or absolute indictors of the effectiveness and/or accuracy of the particular manufacturing stage. If one or more operating conditions fall outside prescribed limits, the system may generate a real-time alert 608. This alert may serve to warn an operator about a problem with a condition at a particular manufacturing stage. The recorded information for the circuit board is then consolidated or stored in a database 610. Stage by stage manufacturing information or metrics for the circuit board may be provided, upon request, as a report 612.

The availability of such manufacturing metrics for each circuit board on a stage by stage basis may permit determining whether a subsequent circuit board problem occurred during the manufacture of the particular circuit board (or batch of circuit boards) or if it occurred as a result of field misuse. Additionally, such manufacturing metrics can also be useful in providing proof that a particular circuit board or batch of boards were manufactured under optimal processing conditions and/or satisfy a certain processing requirements (e.g., perfect conditions, etc.).

Employing the RFID tag to track the progress, status, and/or history of each printed circuit board through its manufacturing stages also helps to optimize the manufacturing process by identify areas where improved processing would be beneficial. This board-by-board tracking also helps to identify defective circuit boards since they can be more easily identified when they fail a quality control or functional test. Moreover, the tracking system provides customers with complete and detailed information about the manufacturing of their circuit boards at every stage of manufacturing. Additionally, a barcode on each circuit board can be used by customers to retrieve a manufacturing report for the circuit board indicating stage-by-stage processing information and whether the circuit board passed all functional and/or quality control tests.

Furthermore, the RFID tag may continue to be used in post-manufacturing stages to track location and/or status information for a circuit board.

Figure 7:
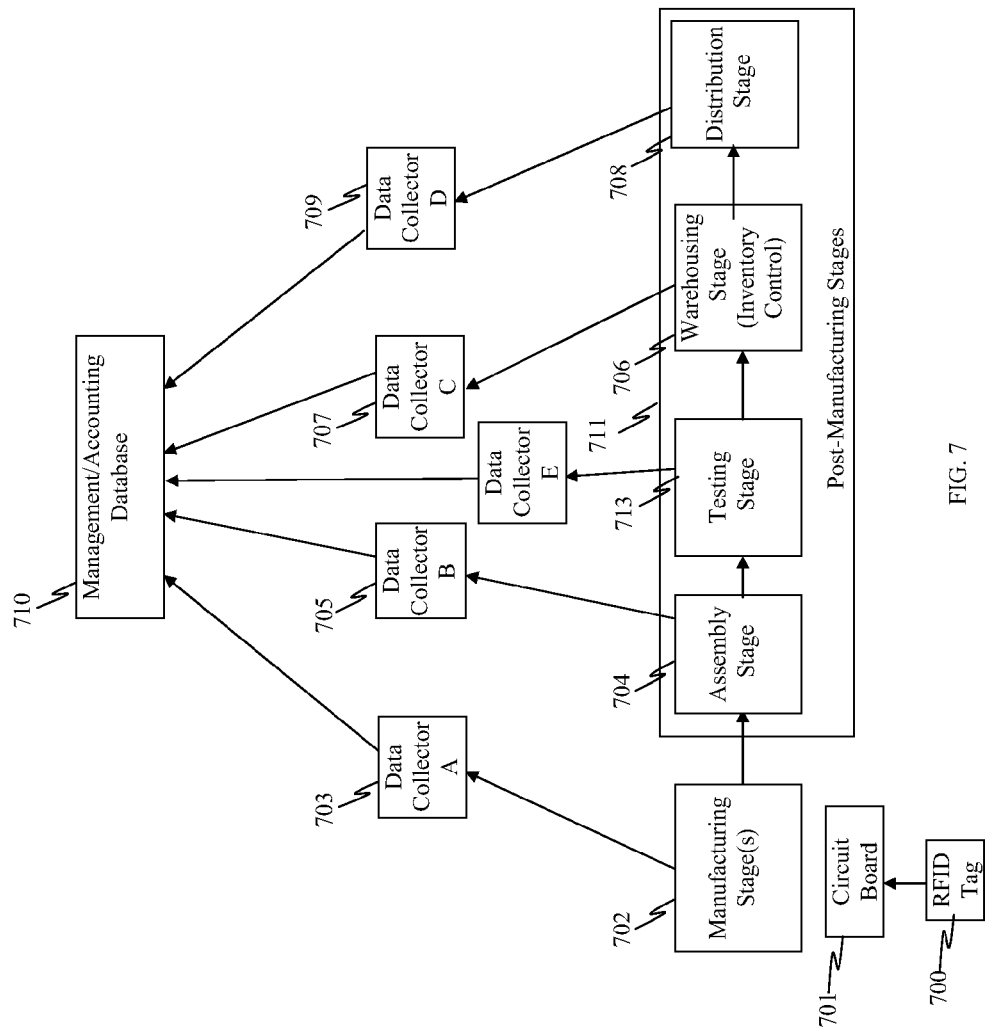
FIG. 7 is a block diagram illustrating that how a circuit board may be tracked during one or more manufacturing stages and post-manufacturing stages using an RFID tag.

FIG. 7 is a block diagram illustrating that how a circuit board 701 may be tracked during one or more manufacturing stages 702 and post-manufacturing stages 711 using an RFID tag 700. As previously discussed, the RFID tag 700 may be coupled or integrated into the circuit board 701 during an early manufacturing stage and used to track one or more manufacturing metric. Additionally, the RFID tag 700 may also be used to track location and/or status information for the circuit board 701 during post-manufacturing states 711, such as an assembly stage 704, a testing stage 713, a warehousing stage 706, and/or a distribution stage 708. The assembly stage 704 may serve to integrate the circuit board 701 into another device (e.g., a chassis). The testing stage 713 may serve to test the combination of assembled components (e.g., circuit boards). The warehousing stage 706 (e.g., hub management) may serve to store the circuit board and perform inventory control using the RFID tag 700. The distribution stage 708 (e.g., fulfillment stage) may serve to distribute the circuit board 701 or the device/product in which it is incorporated. The RFID tag 700 may serve to track the location or status at each of these post-manufacturing stages 711. A plurality of data collectors 703, 705, 707, and/or 709 may serve to collect such information at each stage and/or read the RFID tag 700. A management and/or accounting database may serve to store the collected information.

According to one aspect, the RFID tags may be used in various components (or devices) integrated into a composite device (e.g., end product). Such components may be manufactured by different manufacturers and, thus, may exhibit slightly different electrical behavior and/or performance. The interaction among such components (e.g., video card, memory card, motherboard, network card, etc.) may cause inconsistent performance and/or failures for certain combination of components. That is, certain combinations of motherboard, memory modules, and/or video cards may cause system failures, crashes, and/or unexpected behavior. Consequently, the various combinations of components may be tracked and/or recorded (e.g., during the assembly stage 704) using the RFID tags for each component. Failures of component combinations may be ascertained from a testing stage or field reporting and tracked based on the RFID tags for such components. This may lead to identifying a particular combination of components as undesirable or failure prone. Such undesirable combination of components may be avoided (e.g., automatically) by the manufacturing system or a warning may be issued to avoid such combination. Thus, the use of RFID tags on components (e.g., circuit boards, etc.) may be used to ascertain if a particular combination of components is undesirable and then to avoid such undesirable combination of components in subsequent products.

According to another aspect, a final validation for a product may be performed (e.g., during the testing stage 713 or the distribution stage 708) by rescanning the RFID tags of all components within a product. Rather than manually and/or visually verifying the components present in a product (e.g., taking apart a product to verify the components, recording part numbers in the end-product, etc.), the use of RFID tags in each component allows validating the end product by merely scanning all RFID tags concurrently. This avoids an often tedious validation stage and largely automates validation of an end product.

Figure 8:
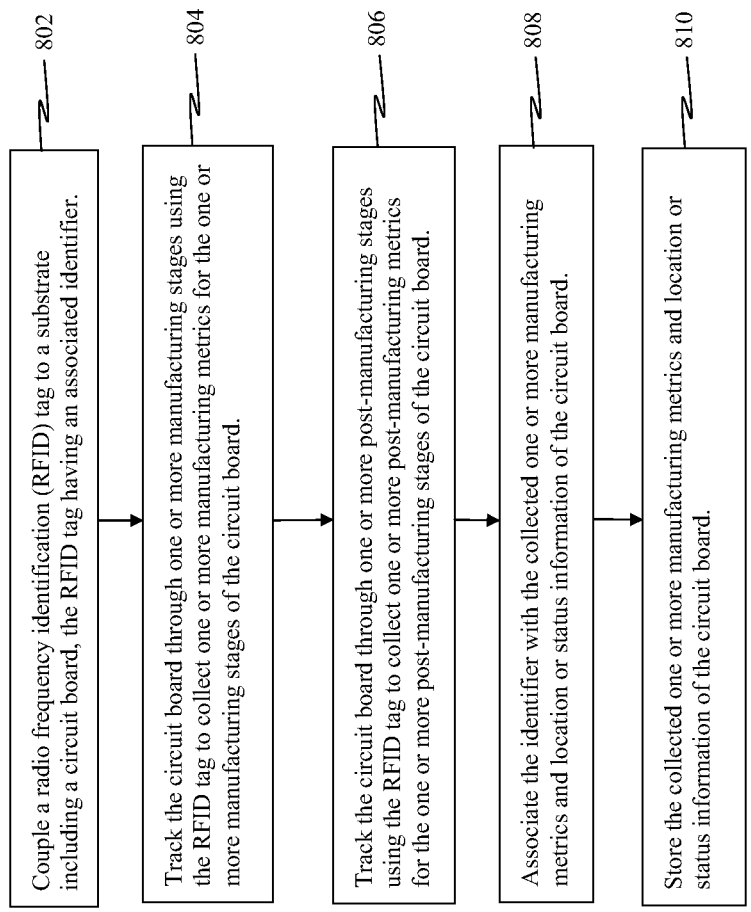
FIG. 8 illustrates a first method for tracking a circuit board.

FIG. 8 illustrates a first method for tracking a circuit board. A radio frequency identification (RFID) tag may be coupled to a substrate including a circuit board, the RFID tag having an associated identifier 802. The substrate may include a plurality of dielectric and conductive layers that form a multilayer circuit board. The circuit board may be tracked through one or more manufacturing stages using the RFID tag to collect one or more manufacturing metrics for the one or more manufacturing stages of the circuit board 804. The RFID tag may be coupled to the substrate prior to adding electrical components to the circuit board. In one example, the RFID tag may be inserted within an optical inspection hole of the circuit board. The one or more manufacturing metrics may include operating conditions of the manufacturing process.

Additionally, the circuit board may further be tracked through one or more post-manufacturing stages using the RFID tag to collect one or more post-manufacturing metrics for the one or more post-manufacturing stages of the circuit board 806. The one or more post-manufacturing stages may include at least one of an assembly stage, a warehousing stage, and a distribution stage. The circuit board may be integrated into another device during the one or more post-manufacturing stages, the RFID tag used to track the device.

The identifier may be associated with the collected one or more manufacturing metrics and location or status information of the circuit board 808. Thus, the collected one or more manufacturing metrics and location or status information of the circuit board may be stored and associated with the identifier 810.

Figure 9:
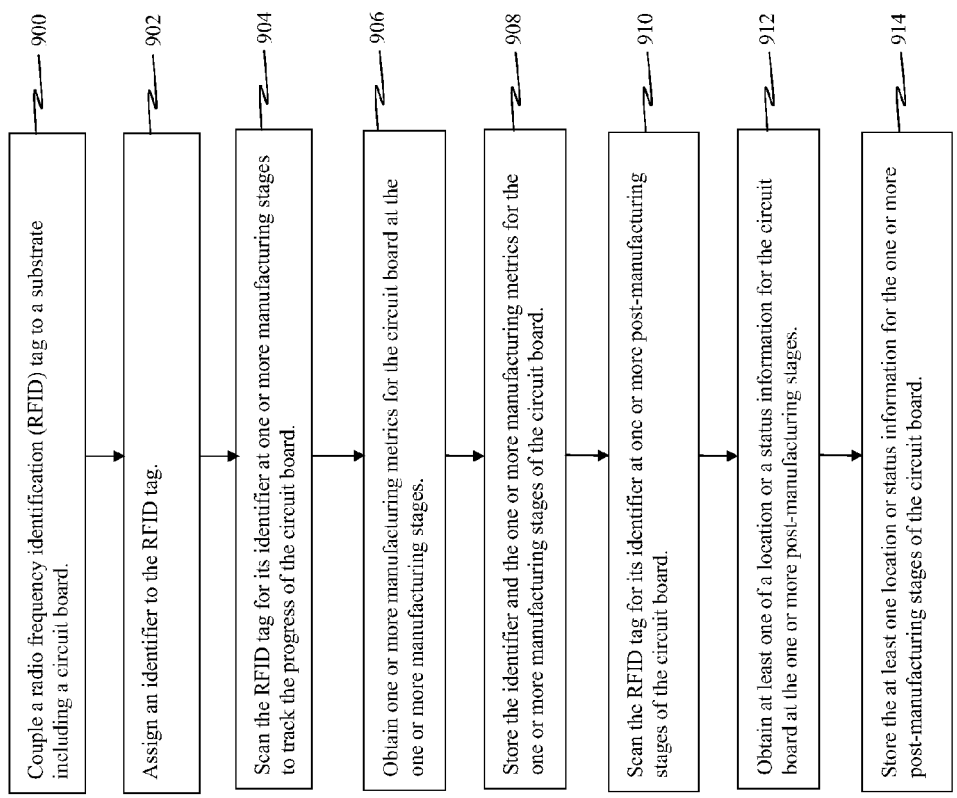
FIG. 9 illustrates another example of a method for tracking a circuit board.

FIG. 9 illustrates another example of a method for tracking a circuit board. A radio frequency identification (RFID) tag may be coupled to a substrate including a circuit board 900 and an identifier may be assigned to the RFID tag 902. The RFID tag may be scanned for its identifier at one or more manufacturing stages to track the progress of the circuit board 904. One or more manufacturing metrics may then be obtained for the circuit board at the one or more manufacturing stages 906. The identifier and the one or more manufacturing metrics for the one or more manufacturing stages of the circuit board may then be stored 908.

Subsequently, the RFID tag may again be scanned for its identifier at one or more post-manufacturing stages of the circuit board 910. At least one of location or status information may be obtained for the circuit board at the one or more post-manufacturing stages 912. The at least one location or status information for the one or more post-manufacturing stages of the circuit board may also be stored 914. The one or more manufacturing metrics and location or status information may be centrally stored by a server.

Figure 10:
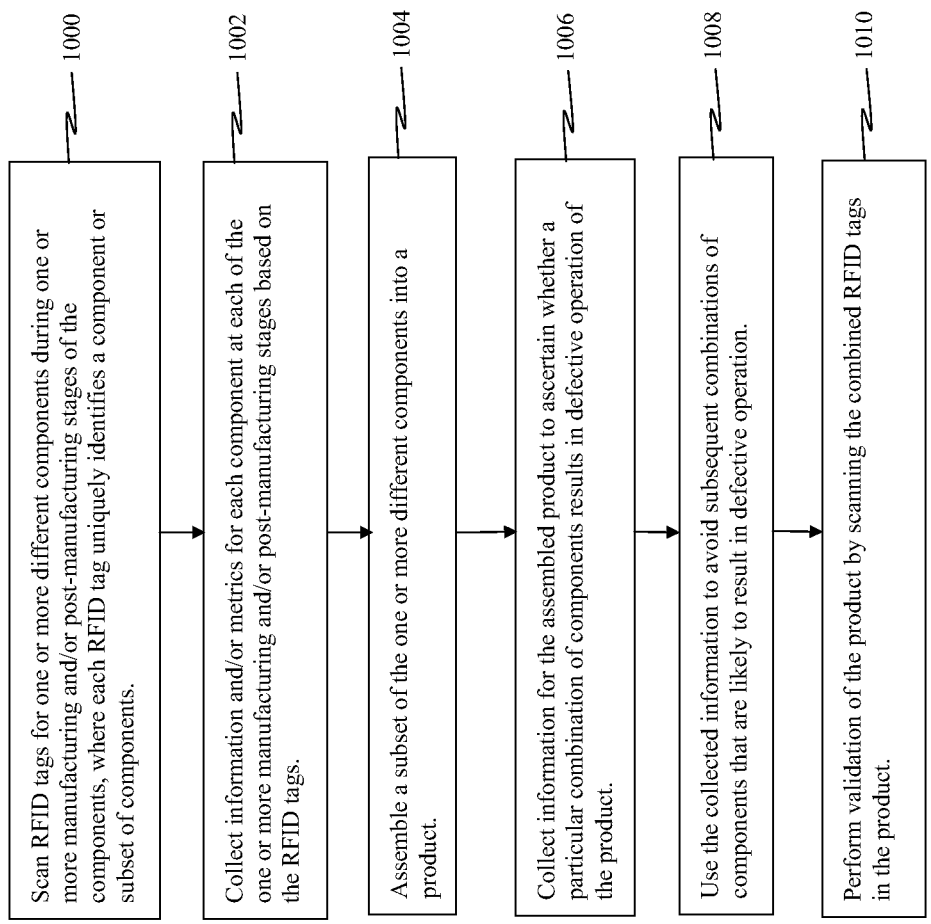
FIG. 10 illustrates an example of a method for using RFID tags to track and/or validate a plurality of components that make part of a composite product.

FIG. 10 illustrates an example of a method for using RFID tags to track and/or validate a plurality of components that may be included as part of a composite product. RFID tags for one or more different components are scanned during one or more manufacturing and/or post-manufacturing stages of the components, where each RFID tag uniquely identifies a component or subset of components 1000. For instance, the RFID tag may emit or broadcast a signal that includes an identifier (e.g., number, code, alpha-numeric string, etc.) that may be associated with the component to which it is coupled. Information and/or metrics may thus be collected for each component at each of the one or more manufacturing and/or post-manufacturing stages based on the RFID tags 1002. A subset of the one or more different components may then be assembled into a product 1004.

The system may collect information for the assembled products to ascertain whether a particular combination of components results in defective operation of the product 1006. The collected information may be used to avoid subsequent combinations of components that are likely to result in defective operation 1008. For instance, if a particular combination of components is found to have failures above a particular threshold, then such combination may be automatically avoided by the assembly system and/or a warning may be issued to the assembly operator.

Validation of the product may be performed by scanning the combined RFID tags in the product 1010.

According to various implementations, the steps for the methods illustrated in FIGS. 1, 2, 6, 7, 8, 9, 10 may be implemented by one or more RFID scanners, computers, servers, storage devices, and/or communication networks. FIG. 4 provides one such exemplary device and/or system.

While various examples and figures herein illustrate the tracking of circuit boards through a manufacturing process, it should be clearly understood that the present invention can be implemented on many other types of items to track them through their manufacturing stages.

One or more of the components and functions illustrated in FIGS. 1, 2, 3, 4, and/or 7 may be rearranged and/or combined into a single component or embodied in several components without departing from the invention. Additional elements or components may also be added without departing from the invention. The apparatus, devices, and/or components illustrated in FIGS. 1, 2, 3, 4, and/or 7 may be configured to perform the methods, features, or steps illustrated in FIGS. 6, 8, 9, and/or 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications are possible. Those skilled, in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A method for tracking a circuit board, comprising:
   coupling a radio frequency identification (RFID) tag to a substrate including a circuit board, the RFID tag having an associated identifier;
   tracking the circuit board through one or more manufacturing stages using the RFID tag to collect one or more manufacturing metrics for the one or more manufacturing stages of the circuit board; and
   tracking the circuit board through one or more post-manufacturing stages using the RFID tag to collect one or more post-manufacturing metrics for the one or more post-manufacturing stages of the circuit board.

2. The method of claim 1, wherein the RFID tag is coupled to the substrate prior to adding electrical components to the circuit board.

3. The method of claim 1, wherein the one or more post-manufacturing stages include at least one of an assembly stage, a warehousing stage, and a distribution stage.

4. The method of claim 1, wherein the RFID tag is inserted within an optical inspection hole of the circuit board.

5. The method of claim 1, wherein the one or more manufacturing metrics includes operating conditions of the manufacturing process.

6. The method of claim 1, wherein the circuit board is integrated into another device during the one or more post-manufacturing stages, the RFID tag used to track the device.

7. The method of claim 1, wherein the substrate includes a plurality of dielectric and conductive layers that form a multilayer circuit board.

8. The method of claim 1, further comprising:
   associating the identifier with the collected one or more manufacturing metrics and location or status information of the circuit board.

9. The method of claim 8, further comprising:
   storing the collected one or more manufacturing metrics and location or status information of the circuit board.

10. A method for tracking a circuit board, comprising:
    coupling a radio frequency identification (RFID) tag to a substrate including a circuit board;
    assigning an identifier to the RFID tag;
    scanning the RFID tag for its identifier at one or more manufacturing stages to track the progress of the circuit board;
    obtaining one or more manufacturing metrics for the circuit board at the one or more manufacturing stages;
    storing the identifier and the one or more manufacturing metrics for the one or more manufacturing stages of the circuit board;
    scanning the RFID tag for its identifier at one or more post-manufacturing stages of the circuit board;
    obtaining at least one of a location or a status information for the circuit board at the one or more post-manufacturing stages; and
    storing the at least one location or status information for the one or more post-manufacturing stages of the circuit board.

11. The method of claim 10, wherein the one or more post-manufacturing stages include at least one of an assembly stage, a warehousing stage, and a distribution stage.

12. The method of claim 10, wherein the RFID tag is inserted within an optical inspection hole of the circuit board.

13. The method of claim 10, wherein the one or more manufacturing metrics includes operating conditions of the manufacturing process.

14. The method of claim 10, wherein the one or more post-manufacturing stages includes an inventory control stage.

15. The method of claim 10, wherein the circuit board is integrated into another device during the one or more post-manufacturing stages, the RFID tag used to track the device.

16. The method of claim 10, wherein the one or more manufacturing metrics and location or status information is centrally stored by a server.

* * * * *